(12) United States Patent
Tadatsu

(10) Patent No.: US 7,511,471 B2
(45) Date of Patent: *Mar. 31, 2009

(54) MAGNETIC BRIDGE ELECTRIC POWER SENSOR

(75) Inventor: Takashi Tadatsu, Koga (JP)

(73) Assignee: Loyal Port Company Limited, Fukuoka (JP)

( * ) Notice: Subject to any disclaimer, the term of this patent is extended or adjusted under 35 U.S.C. 154(b) by 351 days.

This patent is subject to a terminal disclaimer.

(21) Appl. No.: 10/573,502

(22) PCT Filed: Sep. 29, 2004

(86) PCT No.: PCT/JP2004/014263

§ 371 (c)(1),
(2), (4) Date: May 22, 2006

(87) PCT Pub. No.: WO2005/040837

PCT Pub. Date: May 6, 2005

(65) Prior Publication Data

US 2007/0024269 A1    Feb. 1, 2007

(30) Foreign Application Priority Data

Sep. 30, 2003    (JP)    ............... 2003-340559

(51) Int. Cl.
G01R 15/18    (2006.01)
(52) U.S. Cl. .................................. 324/117 R
(58) Field of Classification Search ............. 324/117 R, 324/126–127

See application file for complete search history.

(56) References Cited

U.S. PATENT DOCUMENTS 5,438,258 A * 8/1995 Maruyama .................. 324/142
7,218,092 B2 * 5/2007 Tadatsu ...................... 324/110

FOREIGN PATENT DOCUMENTS

| JP | 01-162165 | 6/1989 |
| JP | 08-304481 | 11/1996 |
| JP | 11-108971 | 4/1999 |
| JP | 2000-329801 | 11/2000 |
| JP | 2001-159646 | 6/2001 |

* cited by examiner

*Primary Examiner*—Ha Tran T Nguyen
*Assistant Examiner*—Shaun Campbell
(74) *Attorney, Agent, or Firm*—Duane Morris LLP

(57) ABSTRACT

A magnetic bridge power sensor including a magnetic bridge having plural magnetic circuits, an excitation coil to generate a magnetic flux in one of the magnetic circuits, and a magnetic flux detection coil to detect the magnetic flux in one of the magnetic circuits. A current, which is obtained by subjecting a current proportional to a voltage on a measurement target power line to at least one of an intermittent processing and an inverting processing, is carried to the excitation coil. The current of the measurement target power line is carried to a detection target current conductor. An output of the detection coil is synchronously detected by a signal having a phase synchronized with a cycle of the intermittent processing or the inverting processing at a frequency twice as high as a frequency of the intermittent processing or the inverting processing.

2 Claims, 6 Drawing Sheets

MAGNETIC BRIDGE ELECTRIC POWER SENSOR

TECHNICAL FIELD

The present invention relates to a power sensor for measuring a power by simultaneously detecting a current and a voltage by one sensor and physically multiplying the current by the voltage by the sensor itself.

BACKGROUND ART

A power can be calculated from a voltage on both ends of a load and a current carried to the load. Specifically, the power can be obtained by multiplying a load current carried to the load by a load voltage applied to the load. However, a power using an alternating-current (AC) power supply cannot be simply calculated since the power includes an effective power that is consumed as an energy and an ineffective power that is not consumed as the energy.

Conventionally, there is generally known the following method for detecting a power. A current detection transformer (CT) calculates the load current, and a voltage detection transformer (VT) calculates the load voltage. In addition, an electronic circuit or a microcomputer multiplies the current by the voltage based on the above-stated principle. With this conventional method, an AC power can be measured but a direct-current (DC) power cannot be measured because of characteristics of the CT and the VT.

Meanwhile, there is known the following method capable of measuring both the DC power and the AC power and directly detecting the power.

The method is executed by a power meter. The power meter is an indicator power meter using an indicator and referred to as an electrodynamometer type power meter. The indicator is moved using a torque acting on between a current coil and a voltage coil, a graduation on the meter indicated by the indicator is read, thereby measuring the power. This power meter measures the power by allowing a user to visually recognize the graduation. Due to this, it is difficult to incorporate this power meter into a recently required automated apparatus and to use it sequentially with a digital signal processing. Actually, the power meter cannot be used for these purposes.

Furthermore, there is known the following power sensor technique (see, for example, Patent Literature 1). With this power sensor technique, a plane of polarization of a Faraday effect optical element is rotated by a magnetic field of the load current, and a light proportional to the load voltage is transmitted by the Faraday effect optical element. A light correlated to both the load current and the load voltage is obtained. The light is subjected to an optical-electric conversion, thereby obtaining an electric signal correlated to the power. This conventional technique has, however, the following disadvantages. This conventional technique cannot ensure high accuracy since errors are accumulated by an electric-optical conversion and the optical-electric conversion. In addition, since this conventional technique uses an optical system, it is not only necessary to employ an expensive optical element but also necessary to use labor and time for adjustment of the expensive optical element. As a result, a cost is too high for the accuracy obtained.

There is further known the following power meter technique (see, for example, Patent Literature 2). With this conventional technique, a current proportional to the load voltage is carried to an input terminal of a Hall element, and a magnetic flux generated by the load current is applied to the Hall element. A voltage proportional to both the load current and the load voltage is thereby obtained from an output of the Hall element. This conventional technique has, however, the following disadvantages. Because of use of the Hall element, sensitivity to the load current is low and the sensitivity has a large fluctuation relative to temperature. Besides, since an irregularity is present among Hall elements, the power can be obtained only at low sensitivity with low accuracy.

Moreover, there is known the following power meter technique (see, for example, patent Literature 3). With this conventional technique, a magnetic field generated by a current proportional to the load voltage and a magnetic field generated by the load current are applied to the same core, and two sensors which detect respective magnetic fluxes by magnetic sensors are provided. One of the sensors calculates a difference between a signal corresponding to the load voltage and a signal corresponding to the load current. The other sensor calculates a sum therebetween. Further, there is a technique that an electronic circuit is used to perform a square difference calculation on results of the both sensors, thereby measuring the power (see, for example, Patent Literature 3). This conventional technique has, however, the following disadvantages. It is necessary to employ as many transformers as those employed in the method for detecting the power using the CT and the PT because two transformers in which a core and a coil are in combination must be employed. With this conventional technique, flux gate type means using the magnetic sensors is adopted as means for detecting the magnetic fluxes of the transformers. Since the two transformers are employed, it is necessary to provide two flux gate circuits as well as a computing circuit and the like. As a result, a circuit scale is inevitably made large.

Patent Literature 1: Japanese Patent Application Laid-Open No. 1-162165

Patent Literature 2: Japanese Patent Application Laid-Open No. 11-108971

Patent Literature 3: Japanese Patent Application Laid-Open No. 8-304481

DISCLOSURE OF THE INVENTION

The present invention has been achieved in view of the conventional disadvantages. It is an object of the present invention to provide a high sensitivity, high accuracy power sensor capable of measuring both a DC power and an AC power using one sensor and directly outputting a power signal without using a magnetic sensor.

According to a first aspect of the power sensor which is the present invention achieved to solve the problem, in the magnetic bridge including: a magnetic circuit 1 having two ends; magnetic circuits 21a and 21b each having two ends, one of the two ends of each of the magnetic circuits 21a and 21b being connected to one of the two ends of the magnetic circuit 1; magnetic circuits 22b and 22a each having two ends, one of the two ends of each of the magnetic circuits 22b and 22a being connected to the other end of the magnetic circuit 1, the other ends of the magnetic circuits 22b and 22a being connected to the magnetic circuits 21a and 21b, respectively; a magnetic circuit 2 having two ends, the two ends being connected to a connection point between the magnetic circuits 21a and 22b and to a connection point between the magnetic circuits 21b and 22a, respectively; an excitation coil 3 provided to be able to generate a magnetic flux in the magnetic circuit 2; and a magnetic flux detection coil 4 provided to be able to detect the magnetic flux in the magnetic circuit 1, a voltage of a measurement target alternating-current power line 5 is applied to the excitation coil 3, and a current proportional to the voltage is carried to the excitation coil 3, current of the measurement target alternating-current power line 5 is carried to a detection target current conductor 5a and an output of the detection coil 4 is synchronously detected by a signal having a phase synchronized with a phase of the voltage of the measurement target alternating-current power line 5 at a frequency twice as high as a frequency of the voltage of the measurement target alternating-current power line 5.

According to a second aspect of the power sensor of the present invention, in the magnetic bridge including: a magnetic circuit 1 having two ends; magnetic circuits 21a and 21b each having two ends, one of the two ends of each of the magnetic circuits 21a and 21b being connected to one of the two ends of the magnetic circuit 1; magnetic circuits 22b and 22a each having two ends, one of the two ends of each of the magnetic circuits 22b and 22a being connected to the other end of the magnetic circuit 1, the other ends of the magnetic circuits 22b and 22a being connected to the magnetic circuits 21a and 21b, respectively; a magnetic circuit 2 having two ends, the two ends being connected to a connection point between the magnetic circuits 21a and 22b and to a connection point between the magnetic circuits 21b and 22a, respectively; an excitation coil 3 provided to be able to generate a magnetic flux in the magnetic circuit 2; and a magnetic flux detection coil 4 provided to be able to detect the magnetic flux in the magnetic circuit 1, a current which is obtained by subjecting a current proportional to a voltage of a measurement target power line 5 to at least one of an intermittent processing and an inverting processing is carried to the excitation coil 3, the current of the measurement target power line 5 is carried to a detection target current conductor 5a, and an output of the detection coil 4 is synchronously detected by a signal having a phase synchronized with a cycle of the intermittent processing or the inverting processing at a frequency twice as high as a frequency of the intermittent processing or the inverting processing.

In the conventional AC power measuring method, the different transformers (PT and CT) detect the load voltage and the load current, respectively, and then the electronic circuit multiplies the voltage by the current. According to the present invention, it suffices to provide one detector in the power sensor using one magnetic bridge. In addition, the detector physically multiplies the voltage by the current. Therefore, the number of parts can be reduced and the power sensor can be made small in size. Further, since the detector is constituted only by a coil and a core, cost can be reduced. Besides, as compared with the conventional transformers (PT and CT) that operate at low frequency, the power sensor according to the present invention can operate 1000 times or more as high as the frequency of the conventional transformers. Therefore, the power sensor can be further made small in size.

In the conventional AC power measuring method, the DC power cannot be measured. According to the second aspect of the present invention, by contrast, the DC power can be measured. Namely, in the conventional DC power measuring method, a weak DC current cannot be measured in a noncontact fashion, so that it is difficult to measure the DC power in a noncontact fashion. According to the present invention, the magnetic bridge a current detection capability of which is already proved by a noncontact current sensor using a magnetic bridge previously patent-applied by the inventor of the present invention is used. Thus, the power sensor according to the present invention has high sensitivity and can, therefore, measure not only the AC power but also weak current AC power in a noncontact fashion.

As the detector of the power sensor according to the present invention, the magnetic bridge (MB) formed by wiring the coil around the core as shown in FIG. 1 is used. As shown in FIG. 1, this magnetic bridge MB includes a magnetic circuit 1 having two ends; magnetic circuits 21a and 21b each having two ends, one of the two ends of each of the magnetic circuits 21a and 21b being connected to one of the two ends of the magnetic circuit 1; magnetic circuits 22b and 22a each having two ends, one of the two ends of each of the magnetic circuits 22b and 22a being connected to the other end of the magnetic circuit 1, the other ends of the magnetic circuits 22b and 22a being connected to the magnetic circuits 21a and 21b, respectively; a magnetic circuit 2 having two ends, the two ends being connected to a connection point between the magnetic circuits 21a and 22b and to a connection point between the magnetic circuits 21b and 22a, respectively; an excitation coil 3 provided to be able to generate a magnetic flux in the magnetic circuit 2; and a magnetic flux detection coil 4 provided to be able to detect the magnetic flux in the magnetic circuit 1.

In the power sensor according to the present invention, an excitation current carried to the excitation coil 3 of the magnetic bridge MB is specified so as to carry the current proportional to a load voltage of the measurement target power.

To generate the excitation current carried to the excitation coil 3 the following two methods can be used.

(1) A first method is a method executable only if the measurement target power is the AC power. In the first method, the excitation current is carried to the excitation coil 3 at the load voltage of the measurement target power. As a method for generating the current proportional to the load voltage, a method for limiting a current by inserting a resistor in serial to the excitation coil 3 is known. This is the simplest and most assured method. However, with this method, the DC power cannot be measured (hereinafter, this method will be referred to as "direct excitation method").

(2) A second method is classified into the following two types (a) and (b). In the method (a), a switch is controlled by a pulse signal generated separately, and the excitation current thus obtained and carried to the excitation coil 3 is turned on and off (conducting/insulating), thereby generating an alternating component magnetic field. In the method (b), a switch is controlled by a pulse signal generated separately, and a connection direction of the excitation coil 3 is inverted to invert the excitation current, thereby generating an alternating magnetic field (hereinafter, the second method will be referred to as "modulation excitation method").

According to the excitation current of this mode, both the DC power and the AC power can be measured. Preferably, the frequency of the pulse signal used at this time is set sufficiently higher than that of the measurement target power. While the frequency of the pulse signal is not limited to a specific one, it is preferable that the frequency is at least a few times as high as that of the measurement target power. This is because if a ratio of the frequency of the pulse signal to that of the measurement target power is lower, a measurement error is greater.

An operation principle of the power sensor according to the present invention will be described.

In the magnetic bridge MB shown in FIG. 1, the magnetic flux generated by the excitation current carried to the excitation coil 3 is applied toward the detection coil 4 by the current of the detection target conductor 5a. As a result, an electromotive force is generated in the detection coil 4. Needless to say, in this magnetic bridge MB, the electromotive force generated in the detection coil 4 (hereinafter, "detection signal") is proportional to the current of the detection target conductor 5a.

A generation source of the magnetic flux that causes the detection signal to be generated in the detection coil 4 of the magnetic bridge MB shown in FIG. 1 is the excitation current carried to the excitation coil 3. With the detection target current being constant, if the excitation current of the excitation coil 3 is increased or decreased, the detection signal is increased or decreased, respectively. That is, the detection signal is proportional to the excitation current.

This shows that if the detection target current is set twice as high as a certain current (x), the detection signal is also twice as high as the certain current (x×2). If the excitation current is increased three-folds, the detection signal is also three times as high as the present detection current (x×2×3). Thus, the detection signal is sixth times as high as the certain current (x×6).

This indicates that the detection signal generated in the detection coil 4 of the magnetic bridge MB is a value obtained by multiplying the detection target current by the excitation current. Therefore, if the load current is set as the detection target current, and the excitation current is set to be proportional to the load voltage, then the detection signal of the detection coil 4 is a value obtained by multiplying the load current by the load voltage. Accordingly, the signal proportional to the power of the measurement target power line can be obtained.

The above-stated operation principle will be described for the power sensor according to the first aspect of the present invention, and that according to the second aspect of the present invention, respectively.

In the power sensor according to the first aspect of the present invention, the excitation current is generated by the direct excitation as already stated. The basic configuration of the power sensor according to the first aspect of the present invention is shown in FIG. 2. In FIG. 2, reference numeral 5 denotes the measurement target AC power line, 51 and 52 denote power transmission terminals, 5a and 5b denote current conductors of the power line 5, and R denotes a load connected to a power receiving side. This power sensor is configured as follows. A detector PS using the magnetic bridge MB is attached to the measurement target current conductor 5a, and the excitation current is carried to the excitation coil 3 of the detector PS through a voltage-to-current converter circuit 35a. A detection circuit 42, on which a synchronous detection circuit 35b acts, detects the detection signal obtained by the detection coil 4 of the detector PS, thereby obtaining a power signal Ws. In this power sensor, it is important to make the excitation current carried to the excitation coil 3 proportional to the voltage of the measurement target power line 5. In addition, it is necessary that the excitation current is the AC current.

If the load voltage is an AC voltage, the current proportional to the AC voltage is an AC current. Therefore, by carrying this AC current to the excitation coil 3 and carrying, as the detection target current, the load current to the measurement target power line 5, the power signal Ws proportional to the detection signal of the detection coil 4 can be obtained.

It is noted that since the detection target current is the AC current, the detection signal of the detection coil 4 also includes a signal directly induced by this detection target current. Nevertheless, the power signal Ws has the frequency twice as high as that of the load voltage and also twice as high as that of the load current. Due to this, the detection signal is processed by electronic circuit means (including a digital signal processing) to extract the signal of the frequency component twice as high as the frequencies of the load voltage and the load current. By doing so, a measurement target power signal can be obtained. According to the first aspect of the present invention, if the load voltage is a DC voltage, the power cannot be measured.

For reference, the load current is often distorted. For this reason, the power cannot be accurately measured only by measuring the signal of the frequency component twice as high as the frequencies of the load voltage and the load current. In addition, the distorted load current (detection target load current) tends to include a frequency component twice as high as the frequencies of the load voltage and the load current. This causes a measurement error.

However, an undistorted load current is often present. In this case, the power sensor according to the first aspect of the present invention can be sufficiently used for a purpose of measuring the power by such an undistorted load current. The power sensor according to the second aspect of the present invention is a power sensor that solves these disadvantages and that can measure the DC power as well as the AC power.

The principle operation of the power sensor according to the first aspect of the present invention will be described with reference to the waveform view typically shown in FIG. 3.

In FIG. 3, a "load voltage waveform" is a waveform of the voltage applied to the load R attached to the measurement target power shown in FIG. 2. A "load current waveform" is a waveform of the current carried to the load R attached to the measurement target power shown in FIG. 2. A "power signal waveform" is a waveform of the signal obtained by extracting only the frequency component twice as high as the frequency of the load voltage from the detection signal of the detection coil 4 by the detection circuit 42.

The power signal Ws includes power information, a content of which information is as follows. An apparent power is proportional to an amplitude of the power signal. An effective power is proportional to the current at the moment the "load voltage waveform" is equal to zero volts. The effective power can be also obtained by the following method. With the power signal at the moment the "load voltage waveform" is equal to zero volts being set zero, the power signal corresponding to one cycle of either the "load voltage waveform" or the "load current waveform" is integrated or averaged. The obtained value is proportional to the effective power. If the waveform is distorted, the effective power can be measured with higher accuracy by the latter method.

An operation of the power sensor according to the second aspect of the present invention will be described.

The excitation current generating (forming) mode applied to the power sensor according to the second aspect of the present invention employs the modulation excitation described above. Due to this, the power sensor whose basic structure is shown in FIG. 4 according to the second aspect of the present invention is configured as follows as compared with that shown in FIG. 2. The power sensor includes measurement target current modulation circuits 31 and 32 (to be described later with reference to FIG. 6 in detail) in place of the voltage-to-current converter circuit 35a shown in FIG. 2, and an oscillator 33 for switching a frequency of the modulation circuits in place of the synchronous detection circuit 35b.

In the power sensor according to the second aspect of the present invention, therefore, the excitation current is excited to a predetermined frequency by an excitation circuit driven based on the frequency set to the oscillator 33 without depending on a power supply frequency. Namely, the excitation coil 3 is excited by a signal obtained by modulating an amplitude of a signal at the predetermined frequency by the load voltage.

It is necessary that the predetermined frequency is at least twice as high as that of the measurement target current. If the predetermined frequency is higher, measurement accuracy is higher. Practically, the predetermined frequency is preferably 100 times or more as high as that of the measurement target current. However, the frequency lower than that is often available.

The two types of modulation excitation means (one is the means by turning on an off the current, and the other is the means by inverting the connection direction of the excitation coil 3) have been described above. In the power sensor according to the second aspect of the present invention, the latter means is adopted by way of example. An excitation current input and output (ON/OFF) switch and a current inversion switch are practically preferably semiconductor switches. However, these switches are not limited to the semiconductor switches.

FIG. 6 is a detailed block diagram of the configuration of the power sensor shown in FIG. 4. Referring to FIG. 6, switches SW1 and SW2 operate synchronously with each other. If the switch SW1 is connected to a lower side, the switch SW2 is set to be connected to an upper side. The switches SW1 and SW2 are controlled by an excitation signal generated by the drive circuit 32, and set to be simultaneously inverted synchronously with the excitation signal.

FIG. 5 is a waveform view schematically showing waveforms of respective units in the power sensor using the modulation excitation method according to the second aspect of the present invention. Referring to the waveforms, the operation of the power sensor according to the second aspect of the present invention will be described.

The waveforms will be described. In FIG. 5, a waveform 1 is a load voltage waveform, a waveform 2 is an excitation signal waveform, and a waveform 3 is an excitation current waveform which is obtained by modulating an amplitude of the excitation signal (waveform 2) by the load voltage (waveform 1).

A waveform 4 is a load current waveform. In FIG. 5, the waveform 4 has a phase delay from the load voltage (waveform 1) by as much as a time indicated by an interval A. A waveform 5 is a detection signal obtained from the detection coil 4. A waveform 6 is a power signal, which is obtained by detecting a phase of (modulating) the detection signal (waveform 5).

Referring to the waveforms shown in FIG. 5, the operation principle of the power sensor according to the second aspect of the present invention will be described.

The power is obtained by multiplying the load voltage by the load current. The measured power shown in FIG. 5 is obtained by multiplying the load voltage (waveform 1) by the load current (waveform 4). A multiplication result is the power signal (waveform 6).

In FIG. 5, the load current (waveform 4) has the phase delay from the load voltage (waveform 1). Generally, if the power is supplied to the load and an impedance of the load is a pure resistor, there is no phase shift between the load voltage and the load current. However, the impedance of the load often contains a reactance. As a result, the phase shift therebetween occurs. The reactance is classified into a capacitive reactance and an inductive reactance. In case of a capacitive load having the capacitive reactance, the load current is higher in phase than the load voltage. In case of an inductive load having the inductive reactance, the load current is lower in phase than the load voltage. Accordingly, the waveforms shown in FIG. 5 are those if the load is the inductive load.

The power is classified into an effective power, an ineffective power, and an apparent power. It is the effective power that can be used as an energy in the load. Electrically speaking, the effective power is a power consumed by a pure resistance component. The ineffective power is a power that exchange an energy with the reactance and that does not consume the energy.

The apparatus power is obtained by adding up a square of the effective power and a square of the ineffective power, and by a square root of the addition result. A value obtained by dividing the effective power by the apparent power is "a power factor", which is used for evaluation of the load.

As can be seen, the AC power cannot be measured accurately if the power factor of the load is taken into consideration. This is why the waveforms having phase sifts are shown by way of example. In case of the DC power, only the effective power is measured. Therefore, it is unnecessary to consider the power factor.

Referring to FIG. 5, the waveform 1 is the load voltage. This load voltage is applied to the voltage terminals 51 and 52 shown in FIGS. 4 and 6. The excitation signal having the waveform 2 controls the current inversion switches SW1 and SW2 shown in FIG. 6 to be turned on and off. In the state shown in FIG. 6, the switch SW1 is closed downward and the switch SW2 is closed upward. It is assumed that this state is a state in which the excitation signal (waveform 2) is at high level. If the signal (waveform 2) is at low level, the switch SW1 is closed upward and the switch SW2 is closed downward. A direction of the current carried to the excitation coil 3 is changed depending on the closing direction of each of these current inversion switches and on the state of the phase of the load voltage.

In FIG. 5, in intervals A and B, the load voltage (waveform 1) is negative, and phases of the excitation signal (waveform 2) and the excitation current (waveform 3) are inverted relative to each other. And they are opposite in phase to each other. In intervals C and D, the load voltage (waveform 1) is positive, and the excitation signal is equal in phase to the excitation current. The current carried to the excitation coil 3 is the excitation current (waveform 3).

While such an excitation current is carried to the excitation coil 3, if the load current (waveform 4) is carried to the detection target conductor, the frequency of the detection signal of the detection coil 4 is twice as high as that of the excitation current. The phase of the detection signal with the load current in a positive direction is inverted from that with the load current is in an opposite direction to the positive direction.

In FIG. 5, in the intervals B and C, the load current (waveform 4) is negative. Therefore, the detection signal (waveform 5) is opposite in phase to the excitation current (waveform 3). In the intervals D and A, the load current is positive. Therefore, the detection signal (waveform5) is equal in phase to the excitation current (waveform 3).

Transition of the state of the phase of the detection signal (waveform 5) relative to the excitation signal (waveform 2) and that of a polarity of the phase-detected power signal are as follows.

In the interval A:

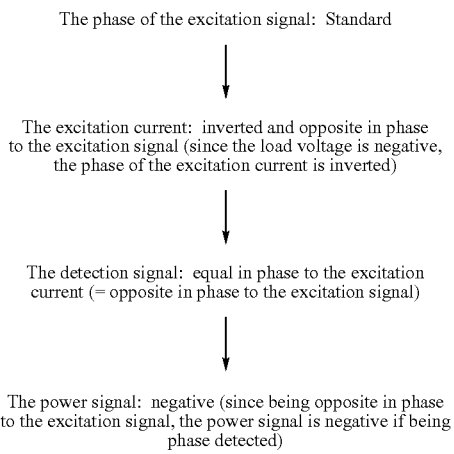

In the interval B:

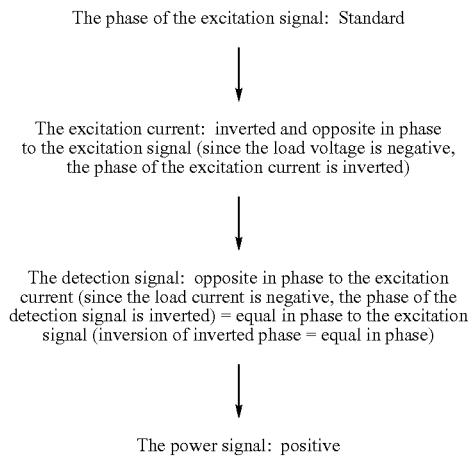

In the interval C:

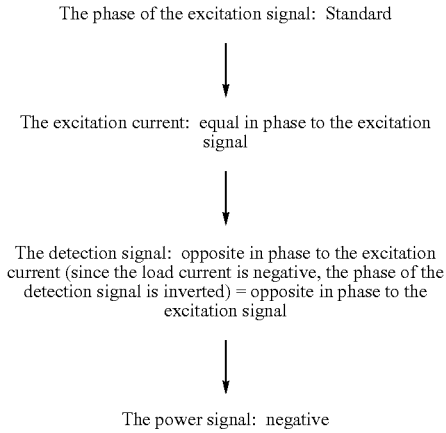

In the interval D:

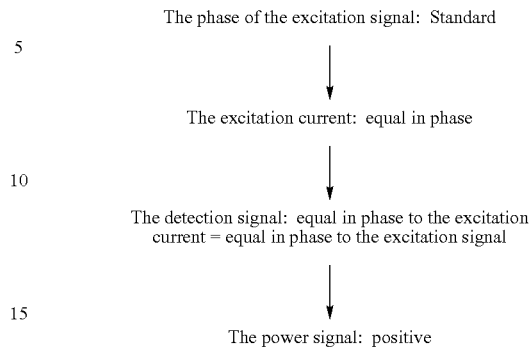

Thus, in summary in the intervals A and C, the power signal is negative. In the intervals B and D, the power signal is positive. Therefore, the power signal has the waveform 6. The power signal obtained by phase-detecting (demodulating) the detection signal (waveform 5) can be obtained as the signal having the waveform equal to the waveform obtained by multiplying the load voltage by the load current.

As for this power signal (waveform 6), the amplitude is proportional to the apparent power and an average is proportional to the effective power. Thus, the apparatus power and the effective power can be measured. Accordingly, the ineffective power can be obtained by a square root of a value obtained by subtracting a square of the effective power from a square of the apparent power. In addition, the power factor can be obtained by dividing the effective power by the apparent power. Further, a phase angle (advanced or delayed) of the load current with respect to the load voltage can be obtained as an inverse tangent function of the power factor.

The power signal waveform shown in FIG. 5 is obtained by drawing an instantaneous power at each time. In the intervals A and C, the consumed power is negative. This means that the power is supplied without being consumed. This is because the energy temporarily accumulated in the reactance (capacitor (capacitance) or the coil (inductance) is discharged.

Accordingly, if an upper part of the waveform is offset by as much as the negative part of the waveform (supplied power), an overall average of the power is at the center of all amplitudes. This indicates the same thing as that described for the power sensor according to the first aspect of the present invention with reference to FIG. 3.

BEST MODE FOR CARRYING OUT THE INVENTION

Figure 6:
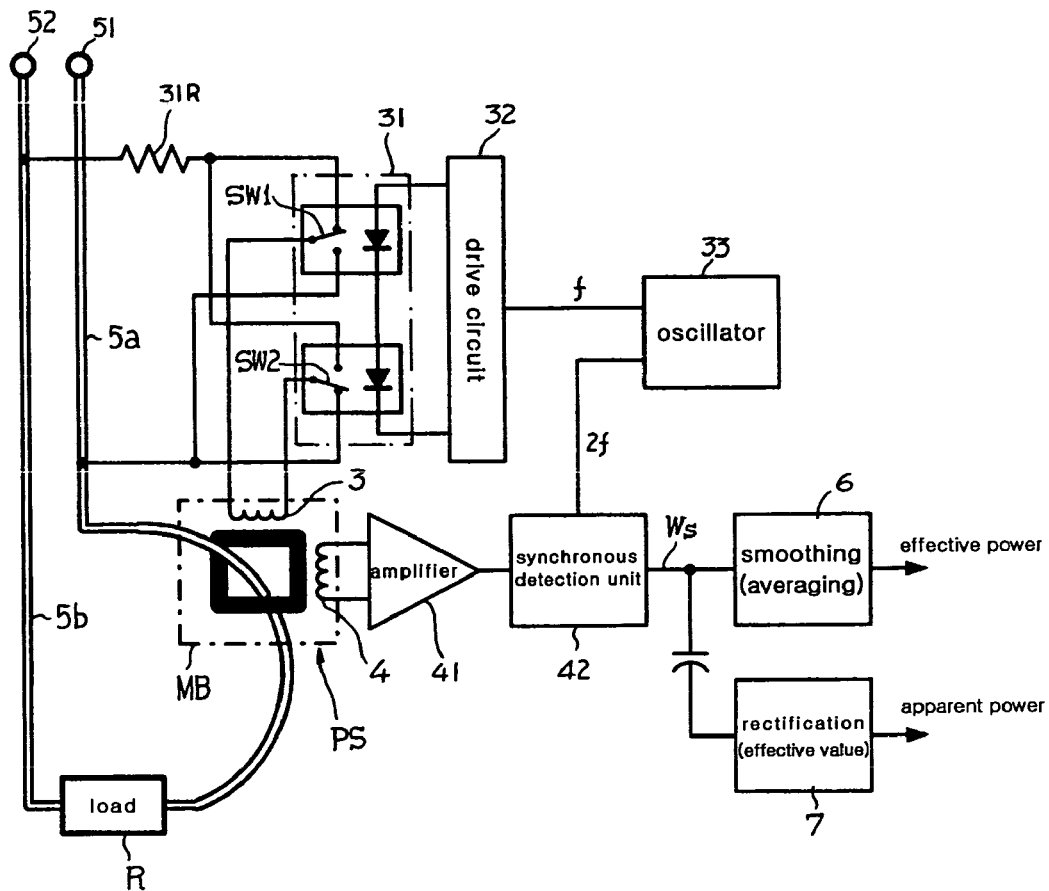
FIG. 6 is a detailed block diagram of the configuration of the power sensor shown in FIG. 4.

Referring to FIG. 6, a power sensor in which inverting method is adapted to a modulation excitation current will be described.

In FIG. 6, reference numeral 5 denotes a measurement target power line. The power line 5 includes detection target current conductors 5a and 5b to which a detector PS using a magnetic bridge (MB) is attached, and load R is connected to power receiving terminals thereof. Reference numerals 51 and 52 denote power transmission terminals of the power line 5. Reference numeral 3 denotes an excitation coil provided in a core of the detector PS. A current obtained by inverting a current of the power line 5 using a switching unit 31 is carried to the excitation coil 3. The switching unit 31 includes semiconductor switches, e.g., photo switches SW1 and SW2 as shown in FIG. 6. Alternatively, switches other than the semiconductor switches can be used. A current-limiting resistor 31R which operates voltage-current conversion is interposed between the power line 5 connected to the switching unit 31 and the switches SW1 and SW2.

A drive circuit 32 for driving the switching current 31 to perform an inverting operation is connected to the switching unit 32. A rectangular wave at a frequency of, for example, about ten kilohertz is supplied to this drive circuit 32 from an oscillator 33. The drive circuit 32 thereby drives the respective switches SW1 and SW2 of the switching unit 31 to be switched so as to specify inversion frequencies of the switches SW1 and SW2.

In addition, an initial amplification circuit constituted by an operational amplifier 41 is connected to the detection coil 4 in the detector PS. An output of the operational amplifier 41 is detected by a synchronous detection unit 42 constituted by, for example, an analog switch and an operational amplifier, thereby generating a power signal Ws. A rectangular wave at a frequency 2 f twice as high as the driving frequency f of the switching unit 31 applied from the oscillator 33 to the drive circuit 32 is applied to the synchronous detection unit 42 as a reference signal for a synchronous detection.

The power signal Ws obtained by the synchronous detection unit 42 is smoothed (averaged) in a smoothing (or an averaging) circuit 6 by an action of obtaining a DC component of the power signal Ws, and output as a measured effective power. In addition, the power signal Ws is rectified in a rectification circuit 7 to thereby obtain an effective value, and an apparent power is output. The measurement target current of the power sensor according to the present invention shown in FIG. 6 may be either an alternating current or a direct current.

Figure 1:
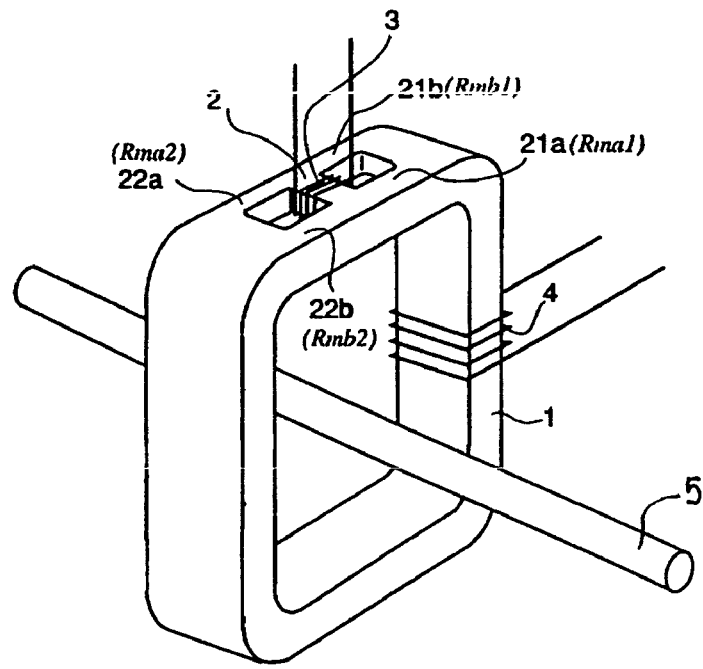
FIG. 1 is a perspective view of an example of a magnetic bridge used in a detector in a power sensor according to the present invention.
Figure 2:
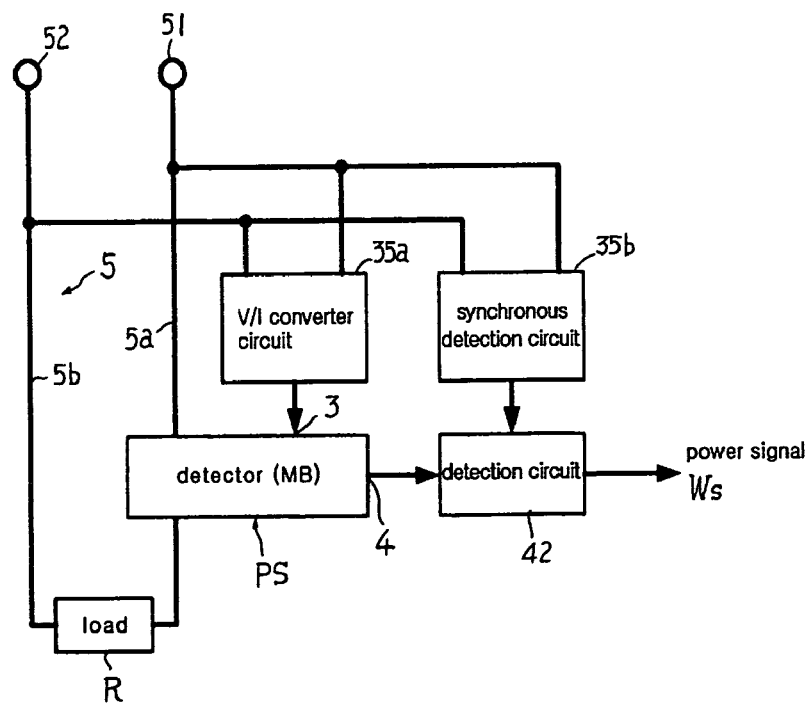
FIG. 2 is a block diagram of an example of a basic configuration of the power sensor according to the present invention.
Figure 3:
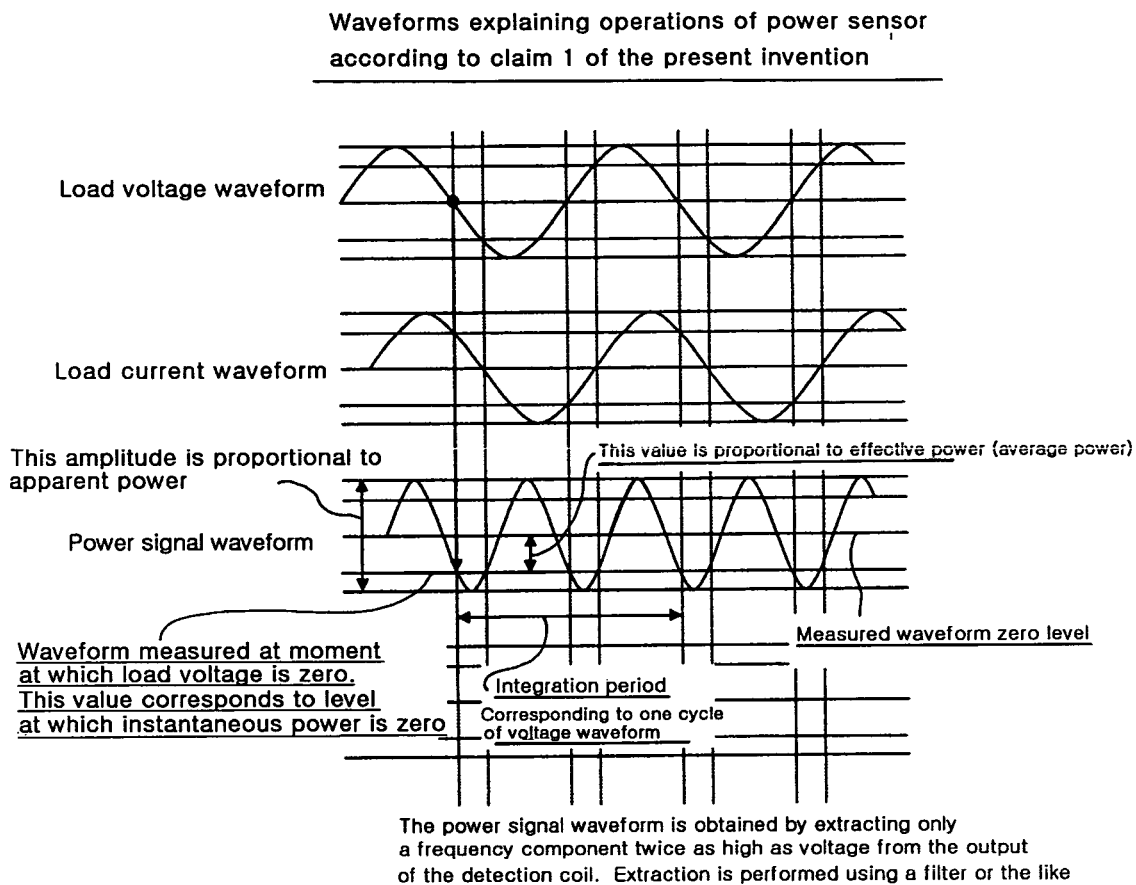
FIG. 3 is a waveform view showing waveforms of respective units in the power sensor shown in FIG. 2.
Figure 4:
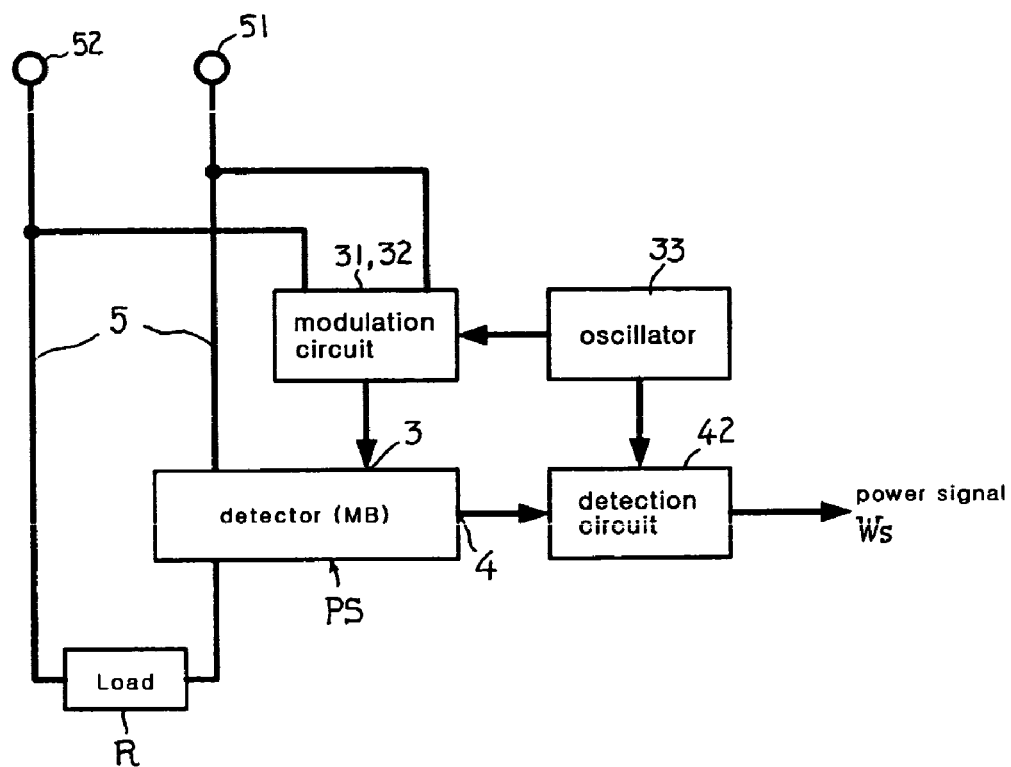
FIG. 4 is a block diagram of another example showing a basic configuration of the power sensor according to the present invention.
Figure 5:
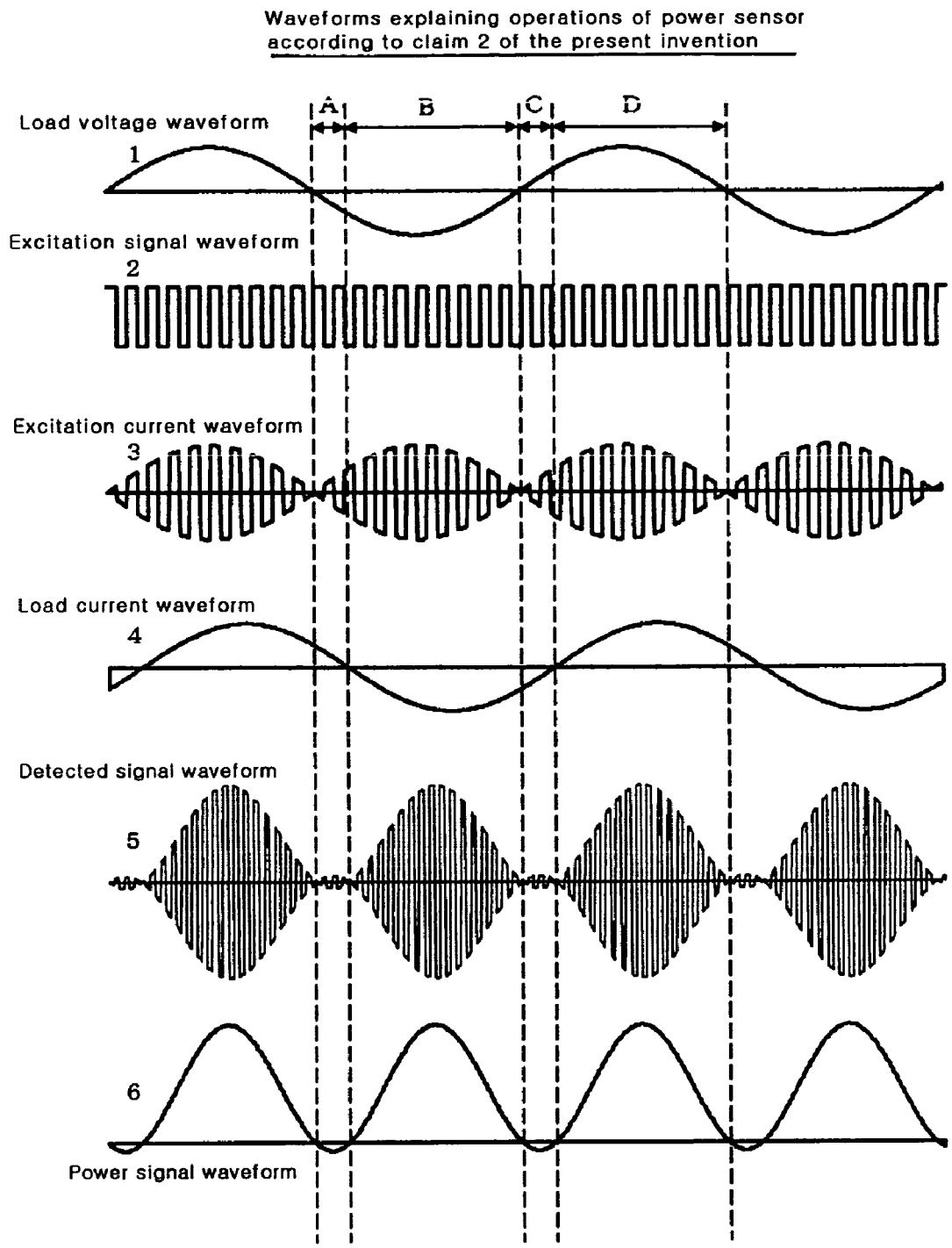
FIG. 5 is a waveform view showing waveforms of respective units in the power sensor shown in FIG. 4.
Figure 7:
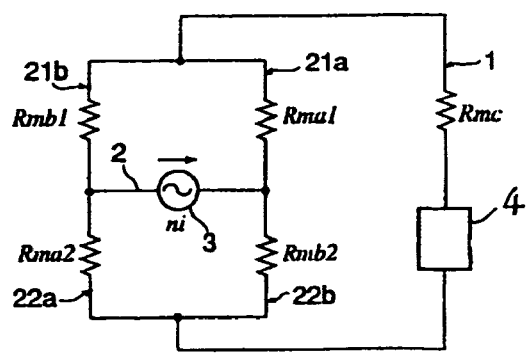
FIG. 7 is an equivalent circuit to the magnetic bridge shown in FIG. 1.
Figure 8:
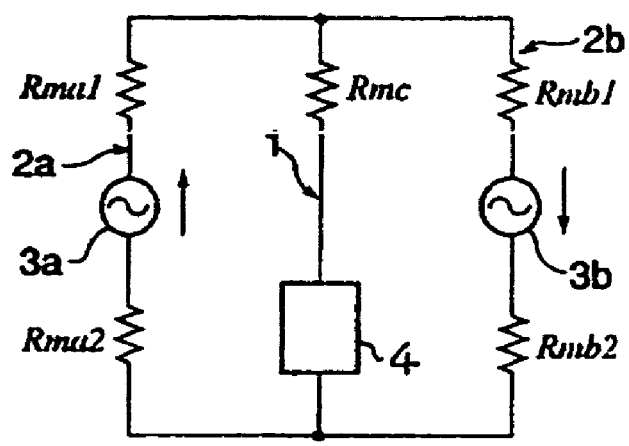
FIG. 8 is an equivalent circuit to the magnetic bridge shown in FIG. 7.
Figure 9:
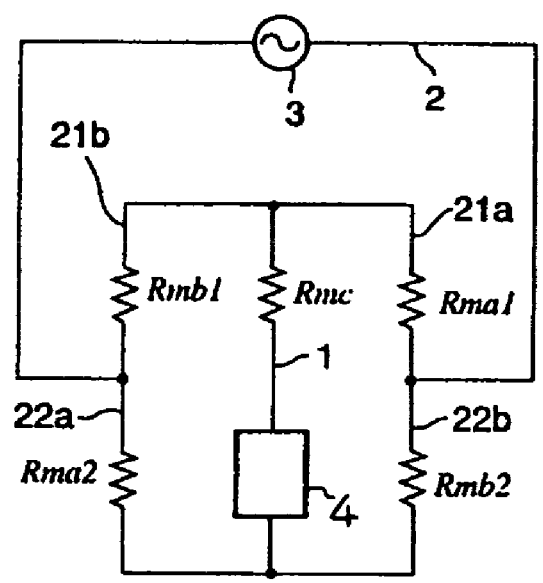
FIG. 9 is an equivalent circuit to the magnetic bridge shown in FIG. 7 or 8.

In detecting PS using the magnetic bridge MB of FIG. 1 which is used for the power sensor of the invention described above, the magnetic bridge MB that can be used in the detector PS is not limited to the magnetic bridge MB shown in FIG. 1. Namely, FIG. 7 shows an equivalent circuit to the magnetic bridge MB shown in FIG. 1. Since this equivalent circuit shown in FIG. 7 is equivalent to circuits shown in FIGS. 8 and 9, the magnetic bridge MB configured as shown in FIG. 8 or 9 can be used for the detector PS of the power sensor according to the present invention. In FIGS. 7 to 9, Rma, Rma1, Rma2, Rmb, Rmb1, and Rmb2 denote magnetic resistances, and the respective resistances have relationships of Rma=Rma1+Rma2, Rmb=Rmb1+Rmb2, Rma1=Rma2, Rma1=Rmb1, and Rma2=Rmb2.

As described so far, the power sensor according to the present invention employs the magnetic bridge (MB). The magnetic bridge MB includes: the magnetic circuit 1 having two ends; the magnetic circuits 21a and 21b each having two ends, one of the two ends of each of the magnetic circuits 21a and 21b being connected to one of the two ends of the magnetic circuit 1; the magnetic circuits 22b and 22a each having two ends, one of the two ends of each of the magnetic circuits 22b and 22a being connected to the other end of the magnetic circuit 1, the other ends of the magnetic circuits 22b and 22a being connected to the magnetic circuits 21a and 21b, respectively; the magnetic circuit 2 having two ends, the two ends being connected to a connection point between the magnetic circuits 21a and 22b and to a connection point between the magnetic circuits 21b and 22a respectively; the excitation coil 3 provided to be able to generate a magnetic flux in the magnetic circuit 2; and the magnetic flux detection coil 4 provided to be able to detect the magnetic flux in the magnetic circuit 1. This magnetic bridge is attached to the measurement target AC power line 5. The voltage of the measurement target AC power line 5 is applied to the excitation coil 3, and the current proportional to the voltage is carried to the excitation coil 3. The output of the detection coil 4 is synchronously detected by a signal having a phase synchronized with the phase of the voltage of the measurement target AC power line 5 at a frequency twice as high as the frequency of the voltage of the measurement target AC power line 5. Alternatively, the magnetic bridge MB is attached to the measurement target AC power line 5, and the current which is obtained by subjecting the current proportional to the voltage of the measurement target power line 5 to at least one of the intermittent processing and the inverting processing, is carried to the excitation coil 3. The current of the measurement target power line 5 is carried to the detection target current conductor 5a. The output of the detection coil 4 is synchronously detected by a signal having a phase synchronized with the cycle of the intermittent processing or the inverting processing at a frequency twice as high as the frequency of the intermittent processing or the inverting processing. Accordingly, a current and voltage can be detected by one detector and the power measurement value can be obtained by physically multiplying the detected values. As a result, a power sensor which is small in size and simple in configuration can be provided.

DESCRIPTION OF THE REFERENCE NUMERALS

MB magnetic bridge
1,2 magnetic circuit
21a, 22a, 21b, 22b magnetic circuit
3 excitation coil
SW1, SW2 switch
31 switching unit
32 driving circuit
4 detection coil
41 operational amplifier
42 synchronous detection unit
5 measurement target alternating-current power line or measurement target power line
5a, 5b detection target current conductor
6 smoothing (averaging) circuit
7 detector

The invention claimed is:

1. A magnetic bridge power sensor comprising a magnetic bridge, the magnetic bridge including:

a magnetic circuit 1 having two ends;

magnetic circuits 21a and 21b each having two ends, one of the two ends of each of the magnetic circuits 21a and 21b being connected to one of the two ends of the magnetic circuit 1;

magnetic circuits 22b and 22a each having two ends, one of the two ends of each of the magnetic circuits 22b and 22a being connected to the other end of the magnetic circuit 1, the other ends of the magnetic circuits 22b and 22a being connected to the second magnetic circuits 21a and 21b, respectively;

a magnetic circuit 2 having two ends, the two ends being connected to a connection point between the magnetic circuits 21a and the magnetic circuits 22b and to a connection point between the magnetic circuit 21b and the magnetic circuit 22a, respectively;

an excitation coil 3 provided to be able to generate a magnetic flux in the magnetic circuit 2; and a magnetic flux detection coil 4 provided to be able to detect the magnetic flux in the magnetic circuit 1, wherein a voltage of a measurement target alternating-current power line 5 is applied to the excitation coil 3, and a current proportional to the voltage is carried to the excitation coil 3, and an output of the detection coil 4 is synchronously detected by a signal having a phase synchronized with a phase of the voltage of the measurement target alternating-current power line 5 at a frequency twice as high as a frequency of the voltage of the measurement target alternating-current power line.

2. A magnetic bridge power sensor comprising a magnetic bridge, the magnetic bridge including:

a magnetic circuit 1 having two ends;

a magnetic circuits 21a and 21b each having two ends, one of the two ends of each of the magnetic circuits 21a and 21b being connected to one of the two ends of the magnetic circuit 1;

a magnetic circuits 22b and 22a each having two ends, one of the two ends of each of the magnetic circuits 22b and 22a being connected to the other end of the magnetic circuit 1, the other ends of the magnetic circuits 22b and 22a being connected to the magnetic circuits 21a and 21b, respectively;

a magnetic circuit 2 having two ends, the two ends being connected to a connection point between magnetic circuit 21a and the magnetic circuit 22b and to a connection point between the magnetic circuit 21b and the magnetic circuit 22a, respectively;

an excitation coil 3 provided to be able to generate a magnetic flux in the magnetic circuit 2; and a magnetic flux detection coil 4 provided to be able to detect the magnetic flux in the magnetic circuit 1, wherein a current, which is obtained by subjecting a current proportional to a voltage of a measurement target power line 5 to at least one of an intermittent processing and an inverting processing, is carried to the excitation coil 3, the current of the measurement target power line 5 is carried to a detection target current conductor 5a, and an output of the detection coil 4 is synchronously detected by a signal having a phase synchronized with a cycle of the intermittent processing or the inverting processing at a frequency twice as high as a frequency of the intermittent processing or the inverting processing.

* * * * *